United States Patent [19]

Imai et al.

[11] Patent Number: 5,517,445

[45] Date of Patent: May 14, 1996

[54] NON-VOLATILE SEMICONDUCTOR MEMORY DEVICE CAPABLE OF ELECTRICALLY PERFORMING READ AND WRITE OPERATION AND METHOD OF READING INFORMATION FROM THE SAME

[76] Inventors: Motomasa Imai, 1-33-7-403, Oshitate-cho, Fuchu-shi, Tokyo; Kazuhide Abe, 3-496-2-307, Tsukagoshi, Saiwai-ku, Kawasaki-shi; Koji Yamakawa, 1195-13-504, Kamisakunobe, Takatsu-ku, Kawasaki-shi; Hiroshi Toyoda, 7-7-2, Kugenumakaigan, Fujisawa-shi, Kanagawa-ken; Yoshiko Kohanawa, 6-11-20-203, Yako, Tsurumi-ku, Yokohama-shi; Mitsuo Harata, 3-8-4-403, Sugeinadazutsumi, Tama-ku, Kawasaki-shi, all of Japan

[21] Appl. No.: 784,073

[22] Filed: Oct. 30, 1991

Related U.S. Application Data

[63] Continuation of Ser. No. 497,920, Mar. 23, 1990, abandoned.

[30] Foreign Application Priority Data

Mar. 28, 1989 [JP] Japan ..................... 1-76059

[51] Int. Cl.$^6$ ................................. G11C 11/22
[52] U.S. Cl. ................ 365/145; 365/149; 365/208; 365/210
[58] Field of Search ................... 365/145, 149, 365/207, 208, 210

[56] References Cited

U.S. PATENT DOCUMENTS

| | | | |
|---|---|---|---|
| 2,791,758 | 5/1957 | Looney | 365/145 |
| 3,691,535 | 9/1972 | Williams | 365/145 |
| 3,832,700 | 8/1974 | Wu et al. | 365/145 |
| 4,161,038 | 7/1979 | Wu | 365/145 |
| 4,873,664 | 10/1989 | Eaton | 365/145 |
| 4,888,630 | 12/1989 | Patterson | 365/145 |
| 4,910,708 | 3/1990 | Eaton et al. | 365/149 |
| 5,010,518 | 4/1991 | Toda | 365/145 |

OTHER PUBLICATIONS

Ferroelectrics, "Thin Ferroelectric Films of $BaTiO_3$ on Doped Silicon"; J. K. Park et al, vol. 10, pp. 217–220 (1976).

Proceedings of 6th ISAF (Int'l Symposium on Applications of Ferroelectrics); "Non–Volatile Memory Behavior of Metal–Ferro–Electric ($BaTiO_3$)—Semiconductor (Si)–MFS Devices"; A. Mansingh et al, pp. 576–579 (1986).

Applied Physics A, "A Study of Electronic States Near the Interface in Ferroelectric—Semiconductor Heterojunction Prepared by rf Sputtering of $PbTiO_3$"; Y. Matsui et al, vol. 28, pp. 161–166 (1982).

*Primary Examiner*—Joseph E. Clawson, Jr.

[57] ABSTRACT

A non-volatile semiconductor memory device, includes a memory cell having a capacitor formed by stacking a semiconductor layer and a ferroelectric layer between a pair of electrodes, the semiconductor layer and the ferroelectric layer forming a semiconductor-ferroelectric junction, a writing circuit in which a voltage higher than a coercive electric field of the ferroelectric material is applied to the capacitor of the memory cell to align a polarization direction of the ferroelectric layer in a predetermined direction so as to set a capacitance of the capacitor at a predetermined value, thereby writing data corresponding to the predetermined value of the capacitance, and a reading circuit in which a voltage less than the coercive electric field of the ferroelectric layer is applied to the capacitor of the memory cell in which the data is written, thereby reading the data.

8 Claims, 6 Drawing Sheets

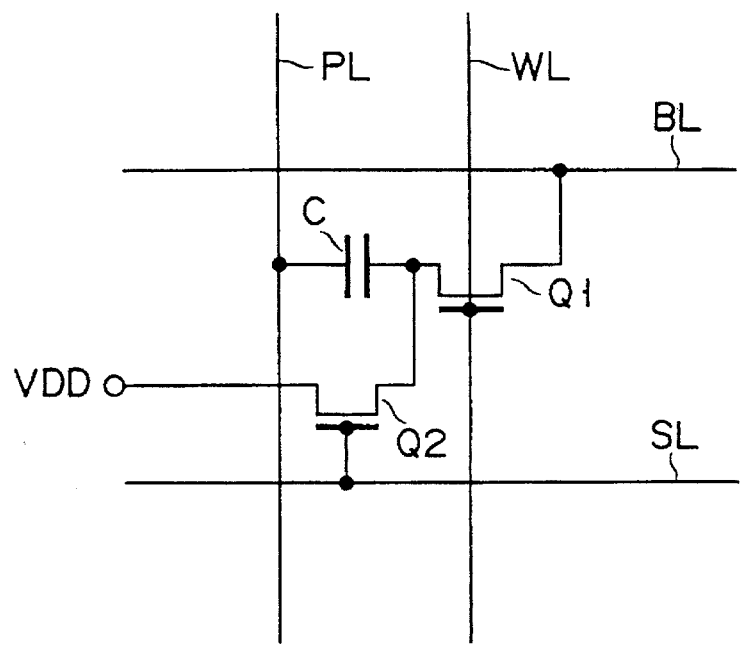
F I G. 3
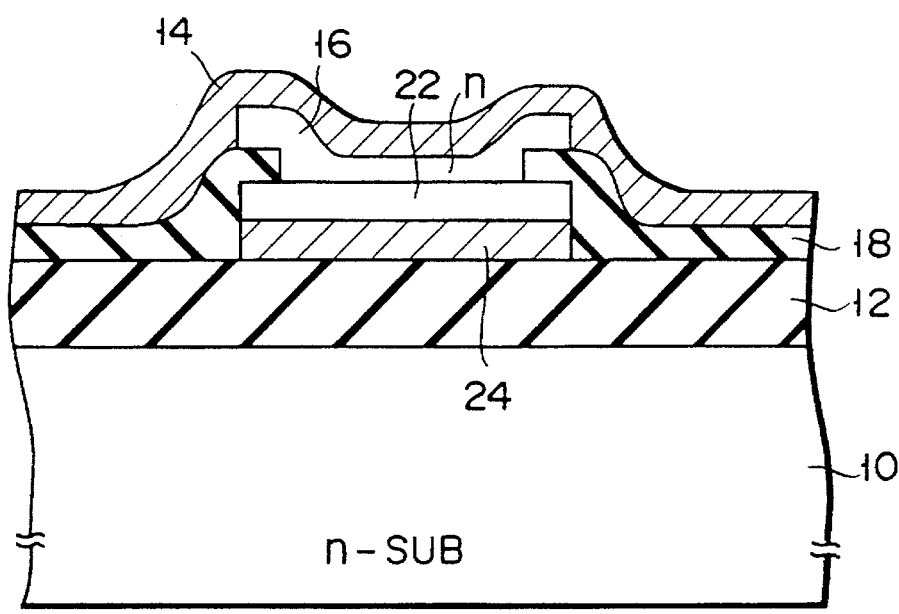
F I G. 4

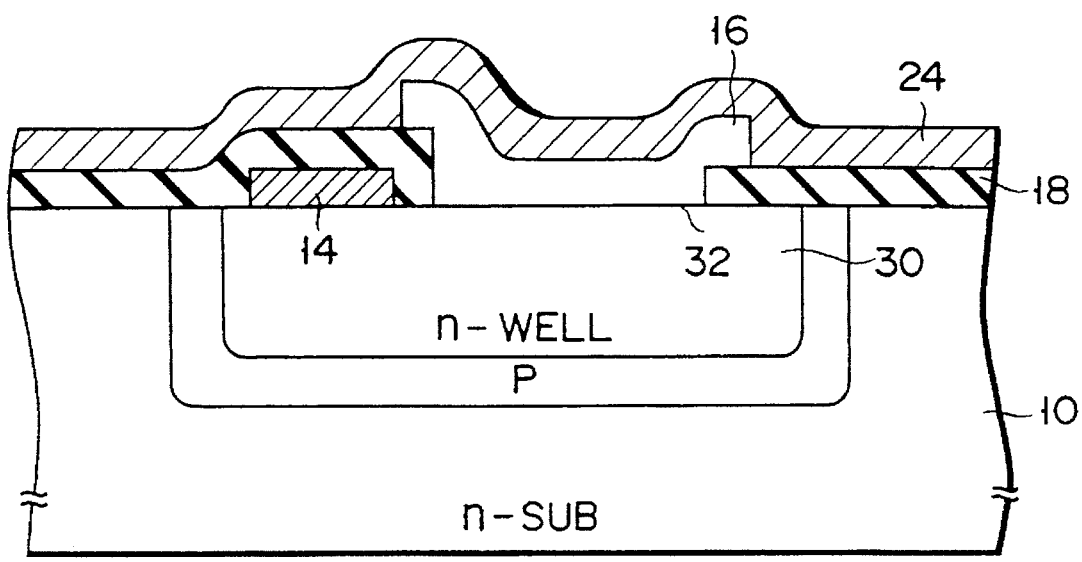
F I G. 5

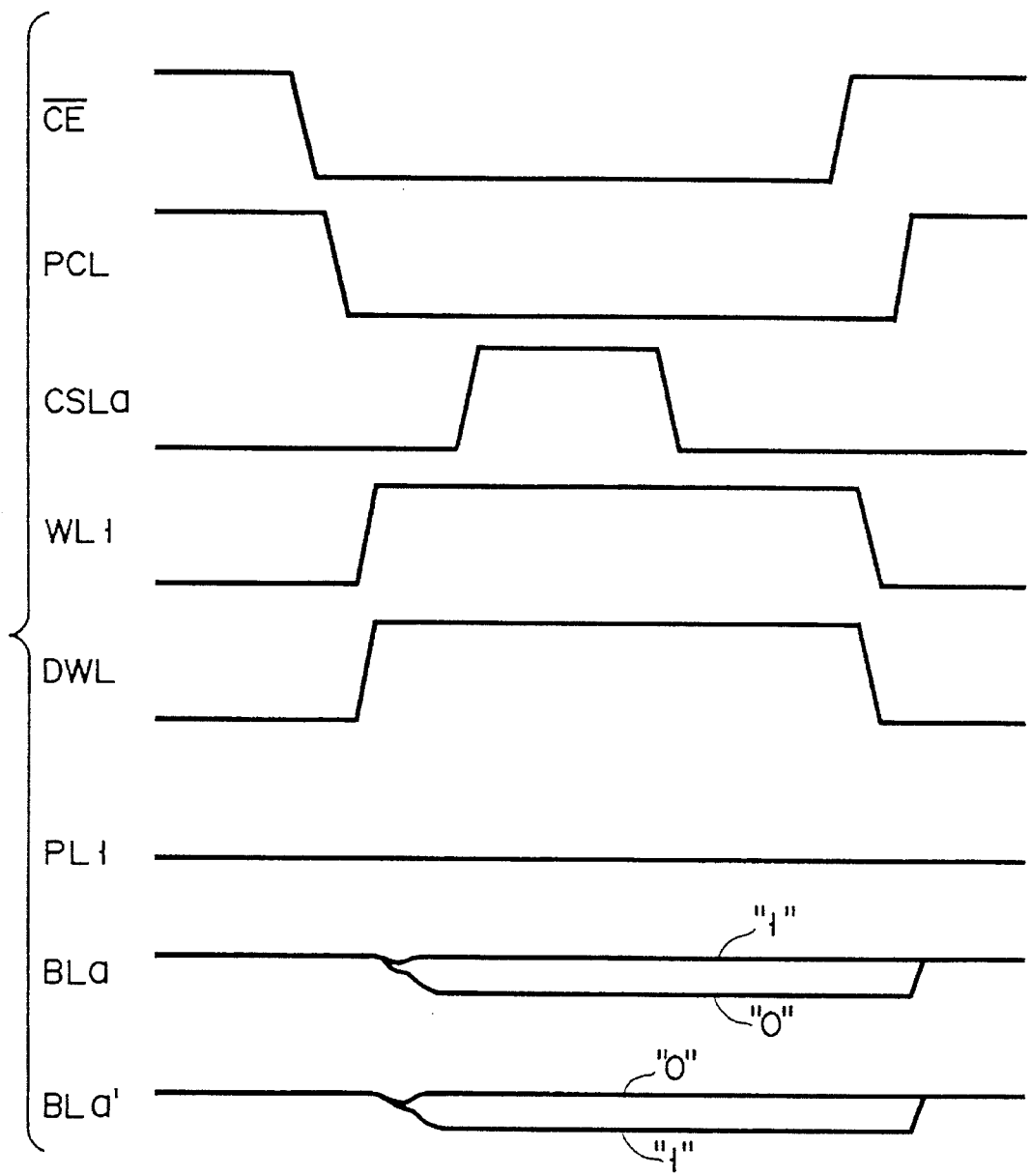
F I G. 7

NON-VOLATILE SEMICONDUCTOR MEMORY DEVICE CAPABLE OF ELECTRICALLY PERFORMING READ AND WRITE OPERATION AND METHOD OF READING INFORMATION FROM THE SAME

This application is a continuation of application Ser. No. 07/497,920, filed on Mar. 23, 1990, now abandoned.

BACKGROUND OF THE INVENTION

1. Field of the Invention

The present invention relates to a non-volatile semiconductor memory device capable of electrically performing read and write operations and method for reading an information from the non-volatile semiconductor memory device.

2. Description of the Related Art

In recent years, techniques related to an electrically erasable non-volatile memory have been rapidly developed, and its variety of applications have been found. A $E^2PROM$ which is a typical example of a non-volatile memory is capable of electrically erasing data and has a high read speed. In the $E^2PROM$, however, a write speed is low, and write/erase cycles are limited.

For this reason, a ferroelectric memory has been recently developed. The ferroelectric memory comprises a plurality of memory cells each having a capacitor using a ferroelectric material as a dielectric. Directions of remanent polarization of the ferroelectric material correspond to data of "0" and "1", and the data is stored in each memory cell. When data is written in the ferroelectric memory, a voltage which is much higher than a coercive electric field is applied to a ferroelectric capacitor of each memory cell in a direction corresponding to desired data. The ferroelectric material is polarized in a direction of the applied voltage, and a part of the polarization remains as remanent polarization after removing the voltage. In addition, when data are read out from the memory cell, a voltage which is much higher than that the coercive electric field is applied to the ferroelectric capacitor of the memory cell in a predetermined direction. When the applied voltage has the same direction as that during write access, polarization is slightly changed, thereby supplying a slight charge current to the ferroelectric capacitor. In contrast to this, when the applied voltage has an opposite direction to the voltage during write access, since remanent polarization is reversed, polarization is largely changed, thereby supplying a large charge current. Therefore, by reading a current amount, data written in each cell is determined to be data of "0" or "1". It is reported that read/write speeds of a ferroelectric memory are several tens nsec. Therefore, the ferroelectric memory can respond at a high speed. The above ferroelectric memory is disclosed in, e.g., U.S. Pat. No. 3,939,292.

However, the above conventional ferroelectric memory has the following problems.

(1) As described above, in the ferroelectric memory, once a read operation is performed, remanent polarization formed in a ferroelectric capacitor has the same direction as a voltage applied for read access independently of a direction of a voltage applied for write access. By this remanent polarization, written data is determined. However, stored data is lost according to this read operation. This read access method is called destructive read access. In order to retain data in the memory cell after its destructive read access, the same data is written in the ferroelectric capacitor of the memory cell again after determining the readout data. In contrast to this, the above $E^2PROM$ employs nondestructive read access in which data is not lost upon read access. When the destructive read access method is performed in a conventional ferroelectric memory, the circuit is complicated compared with the nondestructive read access since a rewrite operation is required.

(2) As described in the above problem (1), since the rewrite operation must be performed in the ferroelectric memory after read access, the direction of polarization of a ferroelectric capacitor is frequently and repeatedly reversed. When reversing of polarization is frequently repeated, ferroelectricity of the ferroelectric material is gradually degraded, thereby decreasing remanent polarization. This phenomenon is called "wear out". It can be understood that this wear out of the ferroelectric material appears by repeatedly reversing spontaneous polarization $10^{12}$ times. When the wear out which decreases the remanent polarization appears, a charge current difference between data of "0" and "1" is decreased during read access. Therefore, the data can hardly be determined. In the ferroelectric memory, its service life is defined by the wear out. Thus, a conventional ferroelectric memory in which polarization is repeatedly reversed to rewrite data after read access has a short service life.

SUMMARY OF THE INVENTION

It is a first object of the present invention to provide a non-volatile semiconductor memory device capable of nondestructively reading data without reversing spontaneous polarization.

It is a second object of the present invention to provide a method for nondestructively reading an information from the non-volatile semiconductor memory device.

According to the present invention, there is provided a non-volatile semiconductor memory device comprising:

a memory cell having a semiconductor-ferroelectric junction capacitor formed by stacking a semiconductor layer and a ferroelectric layer between a pair of electrodes, the semiconductor layer and the ferroelectric layer forming a semiconductor-ferroelectric junction;

a writing means, in response to a voltage which is higher than a coercive electric field of the ferroelectric layer and is applied to the capacitor of the memory cell, for aligning a polarization direction of the ferroelectric layer in a predetermined direction to set a capacitance of the capacitor at a predetermined value, and for writing data corresponding to the predetermined value of the capacitance; and a reading means, in response to a voltage which is less than the coercive electric field of the ferroelectric layer and is applied to the capacitor of the memory cell in which the data is written, for reading the data.

The semiconductor-ferroelectric junction capacitor (ferroelectric capacitor) is one having a single semiconductor-ferroelectric junction between electrodes. For example, there are semiconductor-ferroelectric junction capacitors having the following structures.

(a) The capacitor includes:
a first insulating film formed on a semiconductor substrate;
a first electrode formed on the first insulating film;

the semiconductor layer formed on the first insulating film and contacting the first electrode;

the ferroelectric layer formed on the semiconductor layer and forming a junction with the semiconductor layer; and a second electrode formed on the ferroelectric layer. The semiconductor substrate is made of, e.g., silicon, and the semiconductor layer is made of, e.g., p- or n-type silicon.

(b) The capacitor includes:

a first insulating film formed on a semiconductor substrate;

a first electrode formed on the first insulating film;

the ferroelectric layer formed on the first electrode;

the semiconductor layer formed on the ferroelectric layer and forming a junction with the ferroelectric layer; and a second electrode formed on the semiconductor layer.

(c) The capacitor includes:

a well region of a first conductivity type formed in a semiconductor substrate of the first conductivity type;

an insulating means for electrically insulating the semiconductor substrate from the well region;

a first electrode contacting the well region;

the ferroelectric layer forming a semiconductor-ferroelectric junction with the well region; and a second electrode contacting the ferroelectric layer.

The ferroelectric layer may be formed on the well region having a predetermined interval with respect to the first electrode. The ferroelectric layer may be a thin film.

(d) A capacitor includes a so-called stacked structure formed by stacking at least one capacitor having the structure (a) or (b) on a semiconductor substrate having a capacitor of the structure (c) through an insulating layer.

The above first and second electrodes are formed by, e.g., Au thin films, Pt thin films, Pd thin films or the like.

The above ferroelectric layer is constituted by a ferroelectric material having a Pb-based perovskite structure containing $Pb(Zr_xTi_{1-x})O_3$ [$0.3 \leq x \leq 0.7$] as a major constituent.

In a read operation using the above read circuit, a voltage lower than a coercive electric field of the ferroelectric material must be applied to a semiconductor-ferroelectric junction capacitor of each memory cell. That is, a voltage which is much lower than the coercive electric field so as not to reverse the remanent polarization must be applied to the capacitor regardless of polarization directions of the ferroelectric material of the capacitor.

In order to perform a write operation, a voltage higher than a coercive electric field of a ferroelectric material of the capacitor is applied across electrodes of the semiconductor-ferroelectric capacitor constituting a plurality of memory cells by a write circuit. That is, a positive or negative voltage which is higher than the coercive electric field is applied across the electrodes to sufficiently obtain polarization. Since the capacitance is formed by a semiconductor-ferroelectric junction, a memory of the present invention is controlled in the following two cases. In one case, the capacitor has a large capacitance because of a combination of polarity (plus or minus) of the ferroelectric material and a conductivity type (p- or n-type) of a semiconductor layer. In the other case, the capacitor exhibits a small capacitance because of series combination of a capacitance of a depletion layer formed in a semiconductor region near the semiconductor-ferroelectric junction and a capacitance of the ferroelectric material. That is, digital data corresponding to a polarization direction of the ferroelectric material corresponds to a capacitance of the semiconductor-ferroelectric junction capacitor.

In order to perform a read operation, a voltage much lower than a coercive electric field of a ferroelectric material of the capacitor is applied to a semiconductor-ferroelectric junction capacitor of each memory cell in which data is written. Thus, a stored charge amount is detected to determine whether the written data is data of "0" or "1". Otherwise, the stored charge is discharged, and the discharge amount is detected to determine whether the written data is data of "0" or "1".

In the read operation, since the applied voltage is much lower than the coercive electric field, reversal of a direction of remanent polarization of a ferroelectric material constituting the capacitor due to the read access voltage can be prevented. That is, since data stored in the semiconductor-ferroelectric junction capacitor is not lost upon read access, nondestructive read access can be performed. Therefore, a conventional complicated circuit for performing a rewrite operation after read access need not to be provided, and the circuit arrangement can be simplified. In addition, data determination is not disturbed by wear out, and a high-performance non-volatile semiconductor memory device having a long service life can be obtained.

A memory of the present invention can be used as a temporary memory capacitor in a normal dynamic random access memory (DRAM). The permittivity of the ferroelectric material is 2 order larger than that of $SiO_2$. The memory of the present invention can be formed to be stacked on the DRAM. As described above, the memory of the present invention can be advantageously formed into an IC. In addition, the memory of the present invention can be employed in a static random access memory (SRAM).

A first method of the present invention for reading an information from a non-volatile semiconductor memory device, said memory device including:

a memory cell having a capacitor formed by stacking a semiconductor layer and a ferroelectric layer between first and second electrodes to form a semiconductor-ferroelectric junction by said semiconductor layer and said ferroelectric layer;

a plate line, connected to said first electrode, for applying a first voltage to said first electrode;

a bit line for applying a second voltage to said second electrode, data stored in said memory being read out into said bit line during read access;

first switching means connected between said second electrode;

a word line for supplying a first switching signal to said first switching means;

supply means for supplying a voltage lower than a coercive electric field of said ferroelectric layer to said second electrode during read access;

second switching means connected between said second electrode and said supply means; and a selection line for supplying a second switching signal to said second switching means, said method comprises the steps of:

setting a voltage of said bit line at a reference voltage;

turning said second switching means on to apply a voltage lower than said coercive electric field of said ferroelectric layer to said second electrode; and turning said first switching means on to read out said data stored in said memory into said bit line.

A second method of the present invention for reading an information from a non-volatile semiconductor memory device, said memory device including:

a plurality of memory cells each having a capacitor formed by stacking a semiconductor layer and a ferroelectric layer between first and second electrodes, said semiconductor layer and said ferroelectric layer forming a semiconductor-ferroelectric junction;

first selection means for selecting a predetermined memory cell from said plurality of memory cells;

a plurality of reference memory cells, having third and fourth electrodes, for storing reference data to be compared with storage data in said plurality of memory cells;

second selection means for selecting a predetermined reference memory cell from said plurality of reference memory cells;

first voltage applying means for applying a first voltage to said first electrode of the selected memory cell;

reference voltage applying means for applying a reference voltage to said third electrode of the selected reference memory cell;

second voltage applying means for applying a second voltage lower than a coercive electric field of said ferroelectric layer to said second electrode during read access; and write/read means for writing data in said selected memory cell during write access and reading said data from said selected memory cell and said reference data from said selected reference memory cell during read access, said method comprises the steps of:

setting a voltage across said first and second electrodes of said selected memory cell at 0 V;

setting a voltage of said write/read means with respect to said second electrode at a value lower than said coercive electric field of said ferroelectric layer; and reading out said data and reference data into said write/read means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram of a non-volatile semiconductor memory device according to the first embodiment of the present invention;

FIG. 4 is a sectional view of a main part of another ferroelectric capacitor used in the non-volatile semiconductor memory device of the present invention;

FIG. 5 is a sectional view of a main part of still another ferroelectric capacitor used in the non-volatile semiconductor memory device of the present invention;

FIG. 7 is a timing chart showing read access of the non-volatile semiconductor memory device according to the second embodiment of the present invention.

DETAILED DESCRIPTION OF THE PREFERRED EMBODIMENTS

Figure 1:
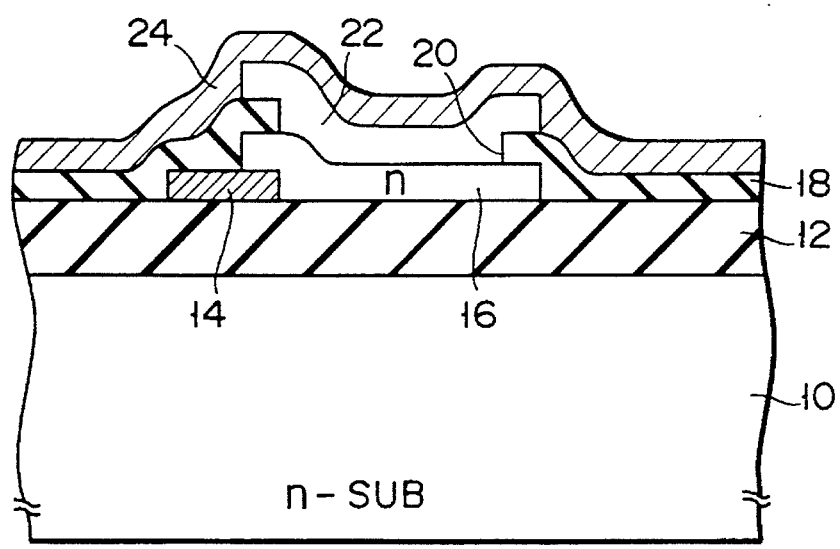
FIG. 1 is a sectional view of a main part of a ferroelectric capacitor used in a non-volatile semiconductor memory device of the present invention.

An embodiment of a ferroelectric capacitor used in a non-volatile semiconductor memory device of the present invention will be described with reference to FIG. 1.

An $SiO_2$ film 12 is formed on an n-type Si substrate 10 on which semiconductor elements are formed in advance. A Pt film having a thickness of about 0.5 µm is formed on the $SiO_2$ film 12 by RF sputtering and patterned by ion-milling to form a first electrode (plate line) 14. An n-type polycrystalline Si layer having a thickness of 1 µm is deposited on the first electrode 14 and the insulating film 12. The n-type polycrystalline Si layer is formed using $SiH_4$ and $PH_3$ as source gases at a pressure of 1 torr and a growth temperature of 550° C. by LPCVD. Thereafter, the n-type polycrystalline Si layer is patterned to form a polycrystalline Si pattern 16.

A 0.5 µm thick insulating layer 18 made of $SiO_2$ is formed on the entire surface of the resultant structure by CVD and patterned to selectively form an opening 20 having a square of 100 µm×100 µm on the polycrystalline silicon pattern 16.

A PZT thin film having a thickness of about 1 µm is formed using a $Pb(Zr_{0.58}Ti_{0.48})O_3$ (PZT) target on the insulating layer 18 and the polycrystalline Si pattern 16 located in the opening 20. During formation of the PZT thin film, RF sputtering is performed in a mixture gas of $Ar/O_2=\frac{1}{2}$ at a pressure of 0.8 Pa and a temperature of 350° C., and thereafter, annealing is performed at a temperature of 650° C. Subsequentially, the PZT thin film is patterned to form a PZT thin film pattern 22. The PZT thin film pattern 22 serves as a ferroelectric layer.

Thereafter, a Pt film having a thickness of about 0.5 µm is formed on the entire surface by RF sputtering and patterned by ion-milling to form a second electrode (bit line) 24. Thus, a semiconductor-ferroelectric junction capacitor is formed.

Figure 2:
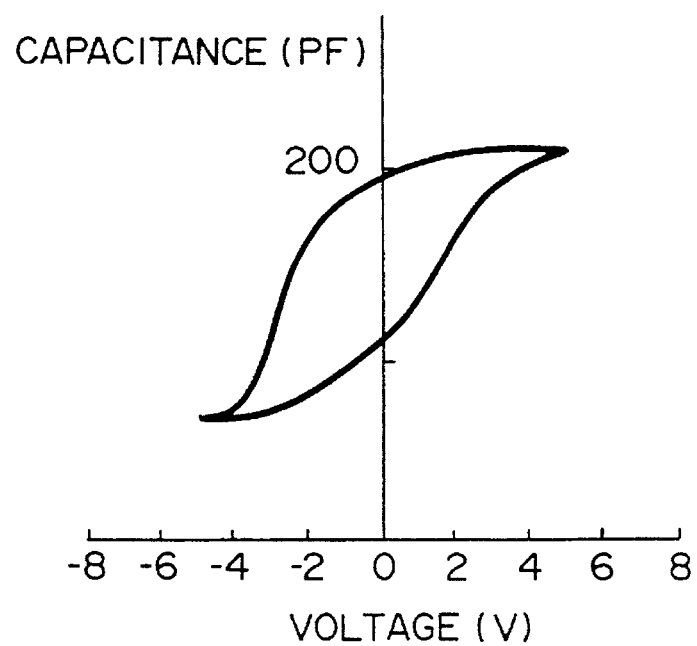
FIG. 2 is a graph showing a relationship between the voltage and capacitance of the ferroelectric capacitor used in the non-volatile semiconductor memory device of the present invention.

FIG. 2 shows voltage-capacitance characteristic curves of the semiconductor-ferroelectric junction capacitor. Referring to FIG. 2, polarization is completed with an applied voltage of about 5 V or more, and the polarization is reversed with an applied voltage of about −5 V or less. When the applied voltage is changed from about 5 V to −5 V, the capacitance of the capacitor is changed from about 210 pF to 80 pF. Therefore, capacitances of this capacitor can be caused to correspond to digital data of "1" and "0".

A non-volatile semiconductor memory device using the above semiconductor-ferroelectric junction capacitor according to the first embodiment of the present invention will be described with reference to FIG. 3. This embodiment includes a write circuit and a read circuit each mounted on the Si substrate 10. Symbol C in FIG. 3 denotes a semiconductor-ferroelectric junction capacitor having the structure shown in FIG. 1. One electrode of the capacitor C is connected to the sources of a first switching transistor $Q_1$ and a second transistor $Q_2$. The gate of the first transistor $Q_1$ is connected to a word line WL. The drain of the transistor $Q_1$ is connected to a bit line BL. The gate of the second transistor $Q_2$ is connected to a selection line SL, and its drain is connected to a $V_{DD}$ level of about 0.5 V.

Write/read operations of the above ferroelectric memory will be described below.

[Write/read operation of digital data of "1"]

The first switching transistor $Q_1$ is turned on by applying a high level to the word line WL to supply a voltage of 5 V to the semiconductor-ferroelectric junction capacitor C from the bit line BL through the first switching transistor $Q_1$. According to the voltage-capacitance characteristic curves in FIG. 2, the capacitor C is polarized to have a capacitance of 210 pF corresponding to data of "1". Thus, write access of digital data of "1" is completed.

The word line WL is supplied with a low level, and the selection line SL is supplied with the high level, thereby turning the second switching transistor $Q_2$ on. A voltage of 0.5 V is applied to the semiconductor-ferroelectric junction capacitor from the $V_{DD}$ level through the second switching transistor $Q_2$ to store charge for read access in the capacitor C. In this state, the bit line BL is maintained at 0 V. Subsequently, the transistor $Q_2$ is made nonconductive, and the word line WL is supplied with the high level, thereby turning the first switching transistor $Q_1$ on. The charge stored in the semiconductor-ferroelectric junction capacitor C is read out to the bit line BL through the transistor $Q_1$. The potential of the bit line is read out as data of "1".

[Write/read operation of digital data of "0"]

The word line WL is supplied with the high level to turn the first switching transistor $Q_1$ on. A voltage of 0 V is applied to the semiconductor-ferroelectric junction capacitor C from the bit line BL through the first switching transistor $Q_1$. Subsequently, the plate line PL is supplied with 5 V. As a result, a voltage of opposite polarity with respect to the above-mentioned "1" state is applied to the capacitor C. According to the relationship of voltage-capacitance in FIG. 2, the capacitor C is polarized to have a capacitance of 80 pF corresponding to data of "0". The write access is therefore completed.

The word line WL is supplied with the low level, and the selection line SL is supplied with the high level, thereby turning the second switching transistor $Q_2$ on. A voltage of 0.5 V is applied to the semiconductor-ferroelectric junction capacitor C from the $V_{DD}$ level through the second switching transistor $Q_2$ to store charge for read access in the capacitor C. In this state, the bit line BL is set at 0 V. Subsequentially, the transistor $Q_2$ is made nonconductive, and the word line WL is supplied with the high level, thereby turning the first switching transistor $Q_1$ on. The charge stored in the semiconductor-ferroelectric junction capacitor C is read out to the bit line BL through the transistor $Q_1$. The potential of the bit line is read out as data of "0".

During the above read access, an output voltage ratio of the data of "1" to the data of "0" is a value of about 1.6. Therefore, the memory of the present invention can be sufficiently utilized as a memory device.

After write access of digital data is performed, the power switch is turned off. After 20 hours, when the same read operation as described above is performed, the output voltage ratio of the data of "1" to the data of "0" is not changed to be a value of about 1.6. Therefore, the memory device of the present invention is confirmed to be non-volatile. Similarly, once write access is performed, the read operation is repeated. As a result, even if the read operation is repeated at least $10^3$ times, the written data is held not to be almost changed. Therefore, this read system is confirmed to be nondestructive.

Note that the semiconductor-ferroelectric junction capacitor C which can be used in the non-volatile semiconductor memory device of the present invention is not limited to the structure shown in FIG. 1.

For example, as shown in FIG. 4, a semiconductor-ferroelectric junction capacitor C may comprise a second electrode 24 formed on a silicon oxide film 12, a PZT thin film pattern 22 formed on the second electrode 24, a polycrystalline silicon pattern 16 formed on the PZT thin film pattern 22 and a first electrode 14 formed on the polycrystalline silicon pattern 16.

For example, as shown in FIG. 5, a semiconductor-ferroelectric junction 32 may be formed by the ferroelectric thin film pattern 16 and an n-well 30 isolated by a p-n junction from the Si substrate 10. The first electrode 14 is formed on the n-well 30. The first electrode 14 is isolated from the ferroelectric thin film pattern 16 by the insulating film 18. A PZT pattern is used as the ferroelectric thin film pattern 16. The second electrode 24 is formed on the PZT pattern 16.

Using a capacitors having the above structure, the non-volatile semiconductor memory in FIG. 3 may be manufactured. In this memory, the same operation as described above can also be performed.

In the circuit structure shown in FIG. 3, the $V_{DD}$ level is used to store charge for read access in the semiconductor-ferroelectric junction capacitor C. However, the second transistor $Q_2$ and the $V_{DD}$ level may be omitted, and the charge for read access may be stored in the semiconductor-ferroelectric junction capacitor C using the bit line BL.

A non-volatile semiconductor memory device according to the second embodiment of the present invention will be described below with reference to FIG. 6.

Each memory cell basically comprises one of memory cell semiconductor-ferroelectric junction capacitors C11, C12, . . . and a corresponding one of pairs of reference capacitors CDa and CDa', . . . A memory cell semiconductor-ferroelectric junction capacitor, e.g., C11, connected to one bit line, e.g., BLa is accessed by selecting a reference capacitor, e.g., CDa' connected to the other bit line, e.g., BLa'. A memory cell semiconductor-ferroelectric junction capacitor, e.g., C21, connected to the other bit line, e.g., BLa' is accessed by selecting a reference capacitor, e.g., CDa connected to one bit line, e.g., BLa. In order to simplify the following description, the semiconductor-ferroelectric junction capacitor C11 will be exemplified as a memory cell.

The memory cell comprises a single semiconductor-ferroelectric junction capacitor C11 and two switching transistor F11 and FP11. A dummy cell comprises a single reference capacitor CDa' and two switching transistors FDa' and FDP'.

A first terminal of the semiconductor-ferroelectric 10 junction capacitor C11 is connected to the bit line BLa through the switching transistor F11 and to a plate line PL1 through the precharge switching transistor FP11. The second terminal of the semiconductor-ferroelectric junction capacitor C11 is connected to the plate line PL1, and the plate line PL1 is connected to a plate drive circuit 40.

The first terminal of the reference capacitor CDa' is connected to the bit line BLa' through the switching transistor FDa' and to a $V_{SS}$ level through a precharge switching transistor FDPa'. The second terminal of the reference capacitor CDa' is connected to the $V_{SS}$ level.

One terminal of each of the bit lines BLa and BLa' is connected to a sense amplifier 42a. The other terminal of each of the bit lines BLa and BLa' is connected to a data input/output circuit 44 through a corresponding one of column selection switching transistors FEa4 and FEa5 and a corresponding one of data input/output lines I/O and I/O'. The gates of the column selection switching transistors FEa4 and FEa5 are connected to a column selection line drive circuit 46 through a column selection line CSLa.

The gate of the switching transistor F11 is connected to a word line WL1, and the word line WL1 is connected to a word line drive circuit 48. The gate of the switching transistor FDa' is connected to a dummy word line DWL', and the dummy word line DWL' is connected to a dummy word line drive circuit 50. The gates of precharge switching transistors FP11 and FDPa' are connected to a precharge drive circuit 52 through the precharge drive line PCL.

The bit lines BLa and BLa' are connected to a Vpc level through switching transistors FEa1 and FEa2, respectively. The bit lines BLa and BLa' are connected with each other by a switching transistor FEa3. The gates of the switching transistors FEa1, FEa2 and FEa3 are connected to the precharge drive circuit 52 through the precharge drive line PCL.

A plurality of word lines WL1, WL2, WL3, WL4, . . . are connected to the word line drive circuit 48, and a desired word line is selected by designation of an address signal. A plurality of plate lines PL1, PL2, PL3, PL4, . . . are connected to the plate drive circuit 40, and a desired plate line is selected by designation of an address signal. The plate drive circuit 40 supplies a predetermined clock voltage to the desired plate line. Dummy word lines DWL and DWL' are connected to the dummy word line drive circuit 50. The dummy word line drive circuit 50 selects a desired dummy word line synchronously with the word line drive circuit 48 to drive the selected dummy word line. The precharge drive circuit 52 supplies a precharge signal to the precharge drive line PCL.

Note that it is preferable that the capacitance of the reference capacitor CDa' falls within the range between two capacitances (by polarization of a ferroelectric material) of the semiconductor-ferroelectric junction capacitor C11, and the capacitance of the reference capacitor CDa' is set to be about an intermediate value between the two capacitances in this embodiment. In addition, the semiconductor-ferroelectric junction capacitor of the present invention comprises an n-type semiconductor arranged to the bit line BLa side and a ferroelectric material formed on the plate line PL1 side.

Figure 8:
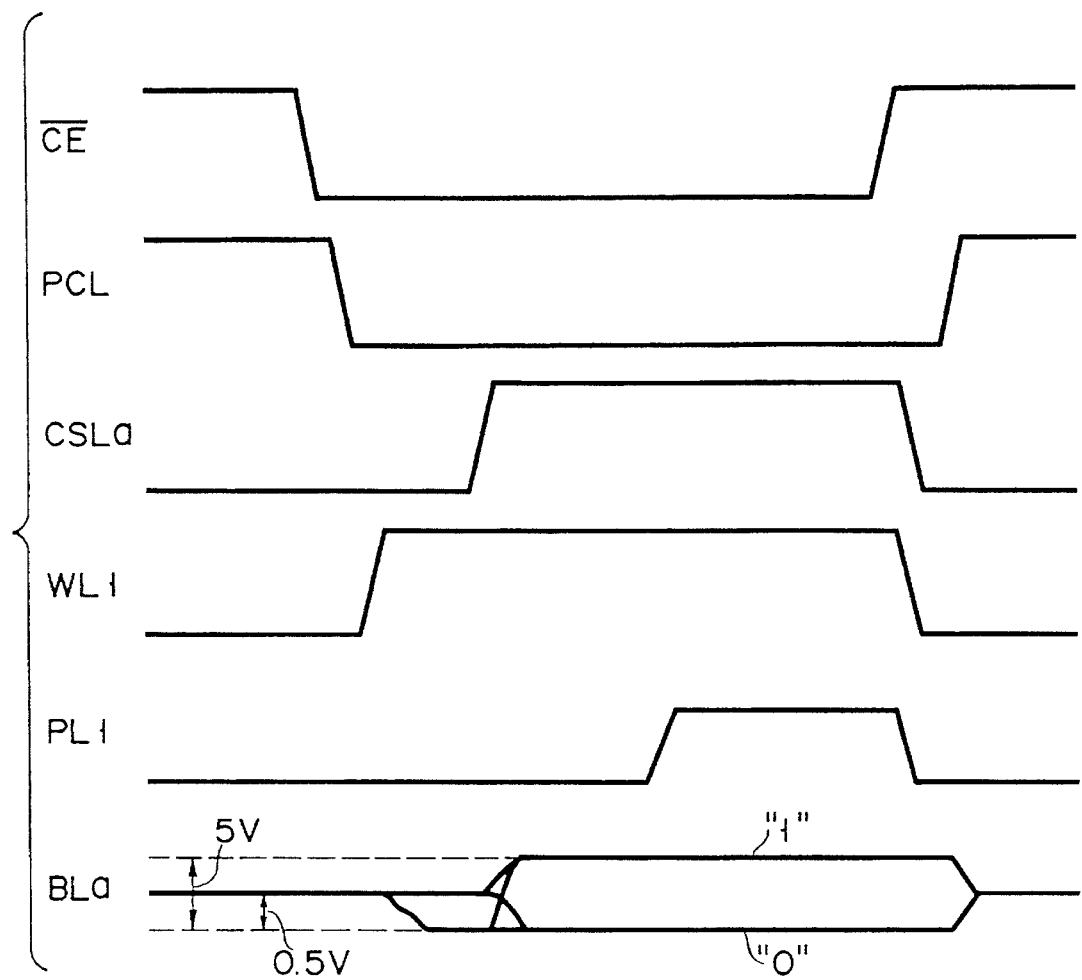
FIG. 8 is a timing chart showing write access of the non-volatile semiconductor memory device according to the second embodiment of the present invention.

FIGS. 7 and 8 are timing charts showing variations in potential of a chip enable $\overline{CE}$, the precharge line PCL, the column selection line CSLa, the word line WL1, the dummy word line DWL', the plate line PL1, and the bit line BLa and BLa'. FIG. 7 shows a read operation, and FIG. 8 shows a write operation.

Figure 6:
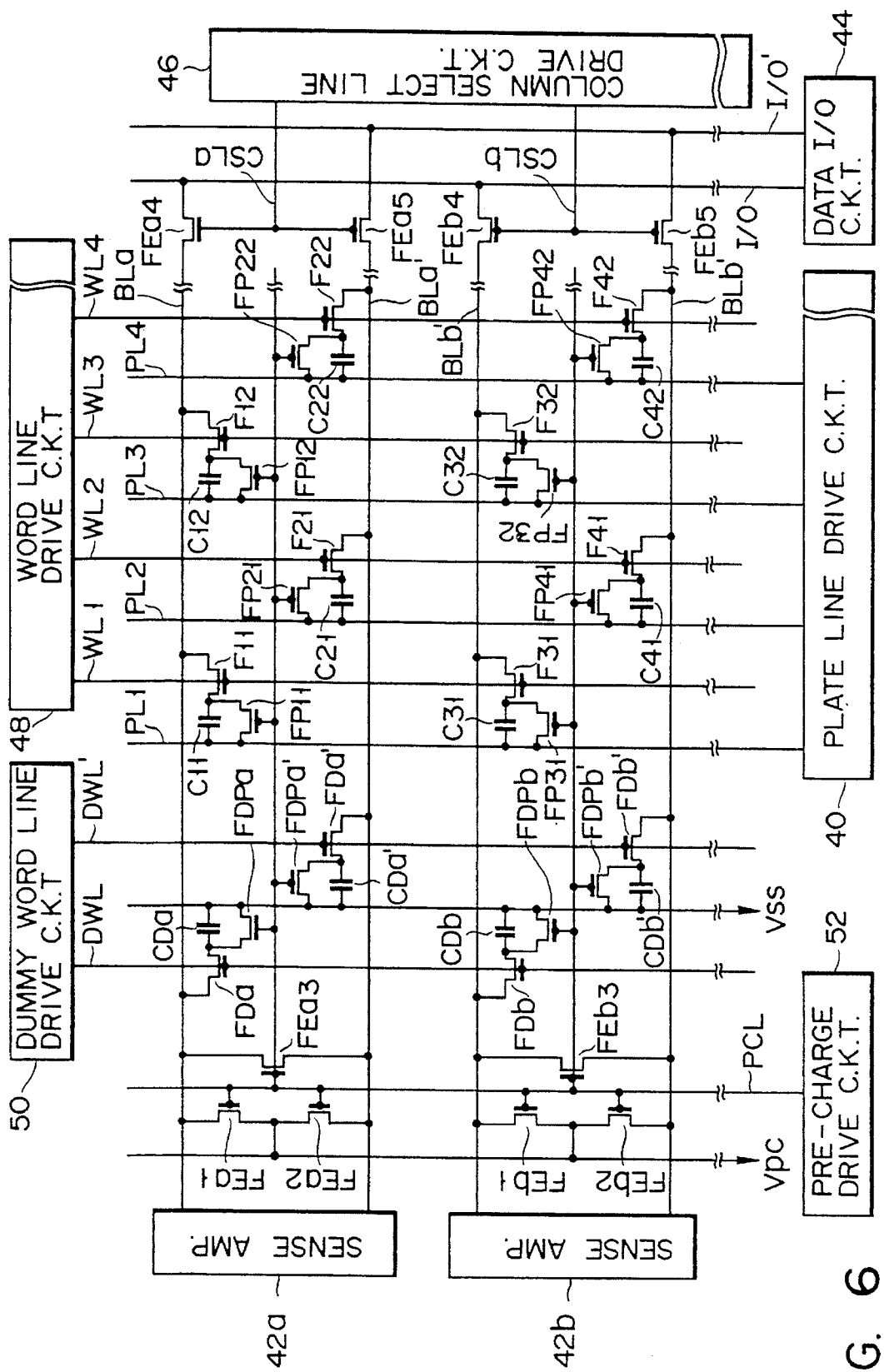
FIG. 6 is a circuit diagram of a non-volatile semiconductor memory device according to the second embodiment of the present invention.

In FIGS. 6 and 7, the read operation is performed as follows. The precharge line PCL is set at high level (7.5 V), and the bit lines BLa and BLa' are precharged to the Vpc level (0.5 V). At this time, terminals of the ferroelectric capacitor C11 and the reference capacitor CDa' are set at the same potential, and neither the capacitors are charged.

A series of operations are started when the external chip enable signal $\overline{CE}$ of a low level, i.e., 0 V is input. The precharge line PCL is driven to low level, and a pair of bit lines is set a floating state of the Vpc level. The word line WL1 and the dummy word line DWL' are selected by designation of an address signal, and the semiconductor-ferroelectric junction capacitor C11 and the reference capacitor CDa' are connected to the bit lines BLa and BLa', respectively. A predetermined charge amount is supplied to the bit line BLa on the basis of data stored in the semiconductor-ferroelectric junction capacitor C11, and a charge amount defined by the capacitance of the reference capacitor CDa' is supplied to the bit line BLa'. Potentials of the bit lines are decreased by magnitudes defined by capacitances of the capacitors and capacitances of the bit lines, respectively.

When a sense amplifier 42a is activated, the pair of bit lines are set at high and low levels, respectively. For example, when the semiconductor-ferroelectric junction capacitor C11 is set at a "1" state (a polarization state when a positive potential is applied to the bit line BLa is defined as "1"), the capacitance of the semiconductor-ferroelectric junction capacitor C11 is smaller than the capacitance of the reference capacitor CDa'. Therefore, a decrease in potential of the bit line BLa is relatively smaller than that of the bit line BLa'. Thus, upon activation of the sense amplifier 42a, the bit lines BLa and BLa' are set at the Vpc level and the $V_{SS}$ level (0 V), respectively.

When the semiconductor-ferroelectric junction capacitor C11 is set at a "0" state (a polarization state when a positive voltage is applied to the plate line PL1 is defined as "0"), the capacitance of the semiconductor-ferroelectric Junction capacitor C11 is larger than that of the reference capacitor CDa'. Therefore, in contrast with the state "1", the bit lines BLa and BLa' are set at the $V_{SS}$ and Vpc levels, respectively.

Thereafter, the column selection CSLa is driven to high level to connect the bit lines BLa and BLa' to the data input/output lines I/O and I/O', respectively. The column selection line CSLa is set to low level to isolate the bit lines BLa and BLa' from the input/output lines I/O and I/O', respectively. Thereafter, potentials of the data input/output lines I/O and I/O' are set on the basis of potentials applied from the bit lines BLa and BLa' using a sense amplifier in the data input/output circuit 44. The data is output from this circuit.

The chip enable signal $\overline{CE}$ is set at high level to restore a precharge state. At this time, the word line WL1 and the dummy word line DWL' go to low level. Thereafter, the precharge line PCL is driven to high level. Thus, a series of read operations are completed.

In FIGS. 6 and 8, a write operation is performed as follows. The same operation as read operation described above is performed until potentials of the bit lines BLa and BLa' are set on the basis of data of the semiconductor-ferroelectric junction capacitor C11.

On the basis of external input data input, potentials of the data input/output lines I/O and I/O' are set by the sense amplifier in the data input/output circuit 44. Thereafter, the column selection line CSLa is driven to high level, and the bit lines BLa and BLa' are connected to the data input/output circuit 44. The potentials of the bit lines BLa and BLa' are forcibly set on the basis of the potentials of the data input/output lines I/O and I/O', respectively. When the bit line BLa is high level, the polarization direction is set to "1" state at the same time with the forcible setting. When the bit line BLa is low level, the plate line PL1 is driven to the $V_{CC}$ level, and the semiconductor-ferroelectric junction capacitor C11 is polarized to the "0" state again, thereby performing a write operation.

In order to restore a precharge state of the memory cell, the chip enable signal $\overline{CE}$ is changed to high level, as described above. As a result, the column selection line CSLa, the word line WL1 and the dummy word line DWL' go to low level. Thereafter, the precharge line PCL is driven to high level, thereby completing a series of write operations.

As described above, according to the present invention, the stored data of the semiconductor-ferroelectric junction capacitor C11 can be read out without reversing polarization.

Note that this embodiment exemplifies the semiconductor-ferroelectric junction capacitor C11. However, the same operation as described above can be performed in selection of other memory cells. For example, upon selection of a semiconductor-ferroelectric junction capacitor C21, a corresponding word line WL2 is selected. As a dummy word line, the dummy word line DWL is selected for selecting the reference capacitor CDa connected to the bit line BLa opposing the bit line BLa' connected to the semiconductor-ferroelectric junction capacitor C21. That is, this operation is the same selecting operation as a "folded" operation performed in a normal DRAM or the like. Selection of a column direction is performed by activating a sense amplifier connected to a pair of bit lines of the column and driving its column selection line.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A non-volatile semiconductor memory device, comprising:

a memory cell having a semiconductor-ferroelectric junction capacitor formed by stacking a semiconductor layer and a ferroelectric layer between a pair of electrodes, said semiconductor layer and said ferroelectric layer forming a semiconductor-ferroelectric junction, the capacitance of said capacitor being changed a detectable amount based on the generation or disappearance of a depletion layer in said semiconductor layer adjacent to said semiconductor-ferroelectric junction;

writing means, in response to a voltage which is higher than a coercive electric field of said ferroelectric layer and is applied to said capacitor of said memory cell, for aligning a polarization direction of said ferroelectric layer in one of predetermined up and down directions with respect to a plane of the semiconductor-ferroelectric junction to set a capacitance of said capacitor at a predetermined value corresponding to the polarization direction based on the generation or disappearance of said depletion layer, and writing data corresponding to the predetermined value of said capacitance; and reading means, in response to a voltage which is less than the coercive electric field of said ferroelectric layer and is applied to said capacitor of said memory cell in which the data is written, for reading the data, said data corresponding to a charge state of said capacitor;

wherein said writing means comprises:

a plate line connected to a first of said pair of electrodes of said capacitor;

a bit line connected through first switching means controlled by a word line to a second of said pair of electrodes of said capacitor;

wherein said voltage higher than said coercive electric field of said ferroelectric layer is applied by said bit line and said plate line;

and wherein said reading means comprises:

a select line controlling a second switching means thereby connecting a voltage lower than said coercive electric field to said second electrode of said capacitor;

wherein said capacitor is precharged via said voltage lower than said coercive electric field of said ferroelectric layer, the charge on said capacitor corresponding to the data of said memory cell.

2. The memory according to claim 1, wherein said ferroelectric layer has a Pb-based perovskite structure containing $Pb(Zr_xTi_{1-x})O_3$ as a major constituent.

3. The memory according to claim 1, wherein said capacitor includes:

a first insulating film formed on a semiconductor substrate;

a first electrode formed on said first insulating film;

said semiconductor layer formed on said first insulating film and contacting said first electrode;

said ferroelectric layer formed on said semiconductor layer and forming a Junction with said semiconductor layer; and a second electrode formed on said ferroelectric layer.

4. The memory according to claim 1, wherein said capacitor includes:

a first insulating film formed on a semiconductor substrate;

a first electrode formed on said first insulating film;

said ferroelectric layer formed on said first electrode;

said semiconductor layer formed on said ferroelectric layer and forming a junction with said ferroelectric layer; and a second electrode formed on said semiconductor layer.

5. A non-volatile semiconductor memory device, comprising:

a memory cell having a semiconductor-ferroelectric junction capacitor formed by stacking a semiconductor layer and a ferroelectric layer between a pair of electrodes, said semiconductor layer and said ferroelectric layer forming a semiconductor-ferroelectric junction;

writing means, in response to a voltage which is higher than a coercive electric field of said ferroelectric layer and is applied to said capacitor of said memory cell, for aligning a polarization direction of said ferroelectric layer in one of predetermined up and down directions with respect to a plane of the semiconductor-ferroelectric junction to set a capacitance of said capacitor at a predetermined value corresponding to the polarization direction, and writing data corresponding to the predetermined value of said capacitance; and reading means, in response to a voltage which is less than the coercive electric field of said ferroelectric layer and is applied to said capacitor of said memory cell in which the data is written, for reading the data, said data corresponding to a charge state of said capacitor;

wherein said capacitor includes:

a well region of a first conductivity type formed in a semiconductor substrate of the first conductivity type;

isolating means for electrically isolating said semiconductor substrate from said well region;

a first electrode contacting said well region;

said ferroelectric layer forming a semiconductor-ferroelectric junction with said well region; and a second electrode contacting said ferroelectric layer.

6. The memory according to claim 5, wherein said isolating means is a semiconductor region of a second conductivity type formed between said semiconductor substrate and said well region, and said semiconductor substrate is isolated by a p-n junction from said well region.

7. A non-volatile semiconductor memory device, comprising:

a memory cell having a capacitor formed by stacking a semiconductor layer and a ferroelectric layer between first and second electrodes to form a semiconductor-ferroelectric junction between said semiconductor layer and said ferroelectric layer, data being stored in said memory call by aligning a polarization direction of said ferroelectric layer in one of predetermined up and down directions with respect to a plane of the semiconductor-ferroelectric junction, wherein the capacitance of said capacitor is changed a detectable amount based on the generation or disappearance of a depletion layer in said semiconductor layer adjacent to said semiconductor-ferroelectric junction and a capacitance of said capacitor is set at a predetermined value corresponding to the polarization direction based on the generator or disappearance of said depletion layer;

a plate line, connected to said first electrode, for applying a first voltage to said first electrode;

a bit line for applying a second voltage to said second electrode, data stored in said memory being read out into said bit line during read access;

first switching means connected between said second electrode and said bit line;

a word line for supplying a first switching signal to said first switching means;

supply means for supplying a voltage higher than a coercive electric field of said ferroelectric layer to said second electrode during write access and supplying a voltage lower than a coercive electric field of said ferroelectric layer to said second electrode during read access;

second switching means connected between said second electrode and said supply means; and a selection line for supplying a second switching signal to said second switching means.

8. Method for reading an information from a non-volatile semiconductor memory device, said memory device including:

a memory cell having a capacitor formed by stacking a semiconductor layer and a ferroelectric layer between first and second electrodes to form a semiconductor-ferroelectric junction between said semiconductor layer and said ferroelectric layer, data being stored in said memory cell by aligning a polarization direction of said ferroelectric layer in one of predetermined up and down directions with respect to a plane of the semiconductor-ferroelectric junction, wherein the capacitance of said capacitor is changed a detectable amount based on the generation or disappearance of a depletion layer in said semiconductor layer adjacent to said semiconductor-ferroelectric junction and a capacitance of said capacitor is set at a predetermined value corresponding to the polarization direction;

a plate line, connected to said first electrode, for applying a first voltage to said first electrode;

a bit line for applying a second voltage to said second electrode, data stored in said memory being read out into said bit line during read access;

first switching means connected between said second electrode and said bit line;

a word line for supplying a first switching signal to said first switching means;

supply means for supplying a voltage higher than a coercive electric field of said ferroelectric layer to said second electrode during write access and supplying a voltage lower than a coercive electric field of said ferroelectric layer to said second electrode during read access;

second switching means connected between said second electrode and said supply means; and a selection line for supplying a second switching signal to said second switching means, said method comprising the steps of:

setting a voltage of said bit line at a reference voltage;

turning said second switching means on to apply a voltage lower than said coercive electric field of said ferroelectric layer to said second electrode; and turning said first switching means on to read out said data stored in said memory into said bit line.

\* \* \* \* \*

UNITED STATES PATENT AND TRADEMARK OFFICE
CERTIFICATE OF CORRECTION

PATENT NO. : 5,517,445
DATED      : May 14, 1996
INVENTOR(S) : Motomasa IMAI, et al.

It is certified that error appears in the above-indentified patent and that said Letters Patent is hereby corrected as shown below:

On the title page, Item [73], the assignee, is missing.
It should read:

--Kabushiki Kaisha Toshiba, Kawasaki, Japan--

Signed and Sealed this

Seventeenth Day of September, 1996

Attest:

BRUCE LEHMAN

*Attesting Officer*          *Commissioner of Patents and Trademarks*